United States Patent
Rzehak

(10) Patent No.: US 7,737,679 B2
(45) Date of Patent: Jun. 15, 2010

(54) POLY PHASE SOLID STATE WATT HOUR METERS

(75) Inventor: Volker Rzehak, Ergolding (DE)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 12/257,947

(22) Filed: Oct. 24, 2008

(65) Prior Publication Data

US 2009/0121705 A1     May 14, 2009

(30) Foreign Application Priority Data

Oct. 30, 2007     (DE) .................. 10 2007 051 794

(51) Int. Cl.
*G01R 11/32*     (2006.01)
(52) U.S. Cl. ...................... 324/142; 324/126
(58) Field of Classification Search ................ 324/142, 324/754, 763, 538, 757, 537, 769, 765, 107; 702/57, 60, 64–65
See application file for complete search history.

(56) References Cited

U.S. PATENT DOCUMENTS 5,701,253 A     12/1997 Mayell et al.
6,023,160 A *   2/2000  Coburn ...................... 324/142
6,646,430 B1 * 11/2003  Skerritt et al. .............. 324/126
6,781,360 B1 *  8/2004  Dragoi et al. ............... 324/126

FOREIGN PATENT DOCUMENTS

GB     2 412 511 A      6/2001
GB     2 431 475 A     10/2005

* cited by examiner

*Primary Examiner*—Minh N Tang
*Assistant Examiner*—Trung Q Nguyen
(74) *Attorney, Agent, or Firm*—Robert D. Marshall, Jr.; W. James Brady; Frederick J. Telecky, Jr.

(57) ABSTRACT

An electronic energy meter includes a first sigma delta modulator having an electrically isolated digital data output. A power supply stage coupled to a first electrical line provides a supply voltage to the first sigma delta modulator. A shunt device is also coupled to the first electrical line. The first sigma delta modulator is coupled via an input to the shunt device for measuring a current through the first electrical line. The electrically isolated digital output is isolated by a capacitive isolation barrier.

7 Claims, 3 Drawing Sheets

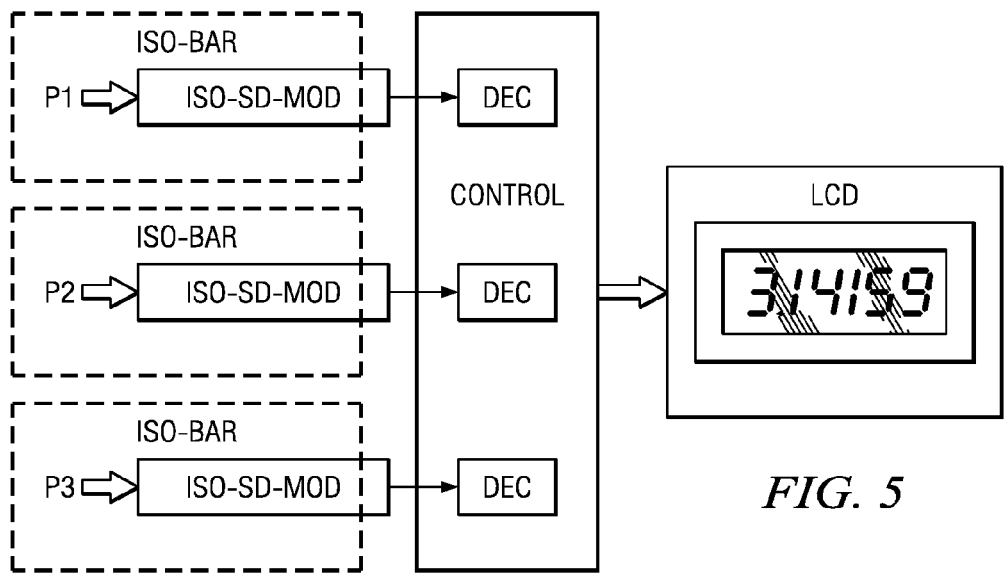
FIG. 5
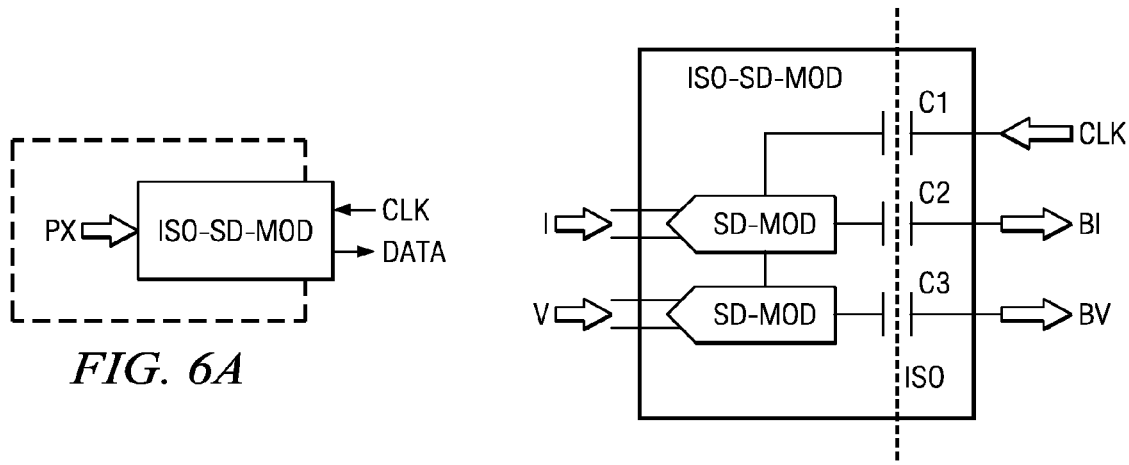
FIG. 6A
FIG. 6B
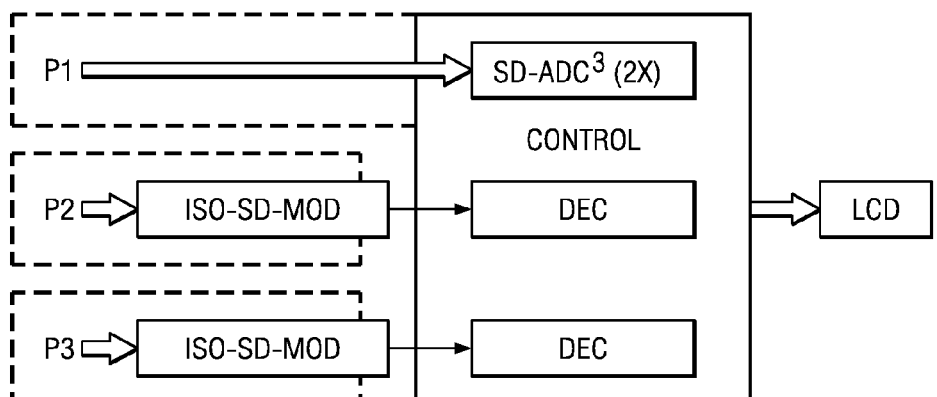
FIG. 7

POLY PHASE SOLID STATE WATT HOUR METERS

CLAIM OF PRIORITY

This application claims priority under 35 U.S.C. 119(a) to German Patent Application No. 10 2007 051 794.9 filed Oct. 30, 2007.

TECHNICAL FIELD OF THE INVENTION

The technical field of this invention is energy meter sand more particularly to an electronic solid state watt-hour meter.

BACKGROUND OF THE INVENTION

Watt-hour meters or electrical energy meters are widely used in almost every household to determine the amount of energy delivered by the electric utility. Regardless of the specific principle used, they all measure and register the integral over time of the power in the circuit. Generally, the watt-hour meter converts the power into a mechanical or an electrical signal and a counter integrates and displays the value of the total energy that has passed through the watt-hour meter. Watt-hour meters may use electronic or mechanical components.

An electric motor is a rather mechanical approach for an energy meter. The torque of this electric motor corresponds to the power consumed in a household or any electronic circuit to which it is connected. A Ferraris or induction-type meter is used for AC energy measurement. Ferraris meters widely used and measure the energy consumption of the vast majority of domestic and industrial users of electric power throughout the world. However, Ferraris energy meters are rather bulky and noisy. They are being slowly replaced by electronic energy meters that can offer additional features like automatic meter reading (AMR).

Electronic solutions preferably rely on shunt resistors coupled directly into the electric line to be measured. The voltage drop across the shunt device corresponds to the current through the electrical line. The voltage level of the electrical line is predetermined. An analog to digital converter digitizes the analog voltages corresponding to the current through the electrical line and to the voltage level at the electrical line. The product of the digital values of voltage and current is the instantaneous power consumed through the electrical line. The integral of this instantaneous power is the energy consumed. A current transformer can be used to measure the current instead of a shunt. Other solutions rely on Rogowski coils or Hall-sensors. However, the cheapest solution uses a shunt.

A major problem to be solved by multi-phase watt-hour meters is the electrical isolation between phases. The electronic meters are coupled through shunt devices and voltage dividers to the electrical line to be measured. These electronic meters experience the high electrical potentials of the electrical lines of up to several hundreds volts. Analog-to-digital converters (ADCs) used in these electronic meters are not designed to withstand such high voltages. At least a part of the electronic components coupled to the electrical line must be electrically decoupled or isolated so that they can float and take the potential of the electrical line.

FIG. 1 illustrates a typical prior art solution to achieve electrical isolation. Three electrical lines correspond to the three phases P1, P2 and P3 of a domestic or industrial power supply network. Three energy meter front ends EMFE1, EMFE2 and EMFE3 are coupled to the phases P1, P2, P3. Electrical front ends EMFE1, EMFE2 and EMFE3 measure the currents and voltages on respective phases. The energy meter front ends EMFE1 to EMFE3 include analog-to-digital converters which convert the analog input voltages representing the currents and voltages through the electrical lines into digital values. The digital values are transmitted to control block CONTROL which may be a microcontroller. Control block CONTROL determines the power in each phase P1, P2 and P3 and the total power or energy consumed. The result is displayed on a liquid crystal display LCD. Three optocouplers OC1 to OC3 establish electrical isolation between the control stage CONTROL and the three energy meter front ends EMFE1 to EMFE3. Directly coupling the three energy meters to control stage CONTROL is impossible because the instantaneous potentials (voltage levels) at the three phases P1 to P3 can differ by hundreds of volts dependent on the specific regional or national standards. Thus each energy meter front end must be electrically isolated by an individual optocoupler. However, optocouplers are rather expensive and they consume a substantial amount of energy themselves which is undesired. If more information or data is to be transmitted even more optocouplers are needed.

FIG. 2 shows an alternative implementation of a prior art energy meter. In FIG. 2 one of the phases P1 is directly coupled to an energy meter front end EMFE provided in the control stage CONTROL at an electrically isolated input to control front end EMFE. This reduces the number of optocouplers required. This alternative is not sufficient to reduce size and costs of the solution to an acceptable amount.

SUMMARY OF THE INVENTION

It is an object of the present invention to provide an electronic energy meter which consumes less power and is cheaper and less complex than prior art solutions.

Accordingly, the present invention is an electronic energy meter that includes a first sigma delta modulator having an electrically isolated digital data output. A power supply stage coupled to a first electrical line provides supply voltage to the first sigma delta modulator. A shunt device is also coupled to the first electrical line. The first sigma delta modulator is further coupled to the shunt device for measuring current through the first electrical line. A capacitive isolation barrier isolated the electrically isolates digital output. The capacitive isolation barrier provides electrical isolation and capacitive coupling through the barrier. These can be used for signal and/or data transmission. Thus the electronic energy meter can be implemented as a single-chip front end that integrates analog to digital conversion as a low cost sigma delta modulator, consumes only a small amount of power and has a low complexity. Because capacitive isolation is cheap to manufacture and consumes no energy itself, it is highly advantageous compared to conventional optocouplers. A capacitive isolation barrier in combination with a sigma delta modulator has a specific synergetic effect because the sigma delta modulator typically outputs very small bit words. This allows only few lines to be used to connect the sigma delta modulator output. Thus the sigma-delta modulator can be combined with the capacitive isolation in a single package.

A sigma delta modulator outputting only a single bit stream is advantageously used. This provides a simple architecture requiring a single capacitive isolation for the sigma delta modulator output. The sigma delta modulator is preferably of second order. This employs a small and simple architecture. A sigma delta modulator of small order with a single bit output stream provides a very cheap but highly efficient energy meter.

The electronic energy meter preferably also includes a second sigma delta modulator having an electrically isolated digital data output with a capacitive isolation barrier and a voltage divider coupled to the first electrical line. The power supply stage supplied the second sigma delta modulator which is coupled to an input of the voltage divider for measuring the voltage level of the first electrical line. The second sigma delta modulator is connected to the power supply stage and receives its input from the voltage divider. The voltage divider is also connected to the first electrical line to measure the voltage level of the first electrical line. Thus the energy meter measures both voltage and current in a domestic or industrial electrical line. The output of the sigma delta modulator is a digital data output having an isolated output provided by a capacitive isolation barrier. Because a capacitive isolation barrier isolates the output of the sigma delta modulator, the analog front end of the meter can be integrated with a digital data output. Digital data is transmitted through the isolation barrier via the capacitive coupling of the capacitive isolation barrier.

The first sigma delta modulator outputs a bit stream at the isolated digital data output representing the current through the first electrical line. The second sigma delta modulator outputs a bit stream at the isolated digital output representing a voltage level at the first electrical line. Both the first and second sigma delta modulators outputs are isolated by a capacitive isolation barrier. Thus their analog front ends can be interfaced with a digital data output. The two sigma delta modulators output bit streams are representative of the current through and the voltage level of the first electrical line.

Advantageously, the energy meter includes an electrically isolated input with a capacitive isolation barrier for a clock signal. The clock signal is input to the front end of the energy meter via an electrically isolated input isolated by a capacitive isolation barrier. Such a clock signal way allows real synchronous operation of several energy meters arranged in an array. This enables measurement of the current through and the voltage drop across all phases (live wires) that are often used in domestic and industrial electricity supplies.

BRIEF DESCRIPTION OF THE DRAWINGS

These and other aspects of this invention are illustrated in the drawings, in which:

FIG. 5 is a simplified schematic of an electronic energy meter according to a third embodiment of the invention;

FIG. 6 is a simplified schematic of an electronic energy meter according to a fourth embodiment of the invention; and FIG. 7 is a simplified schematic of an electronic energy meter according to a fifth embodiment of the invention.

DETAILED DESCRIPTION OF PREFERRED EMBODIMENTS

Figure 1:
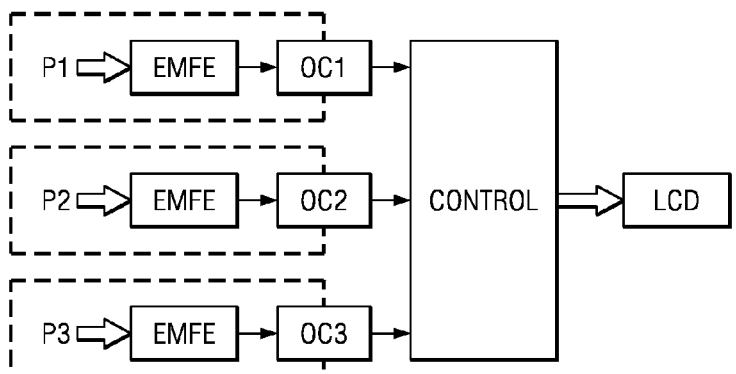
FIG. 1 is a simplified schematic of a conventional electronic energy meter (prior art)
Figure 2:
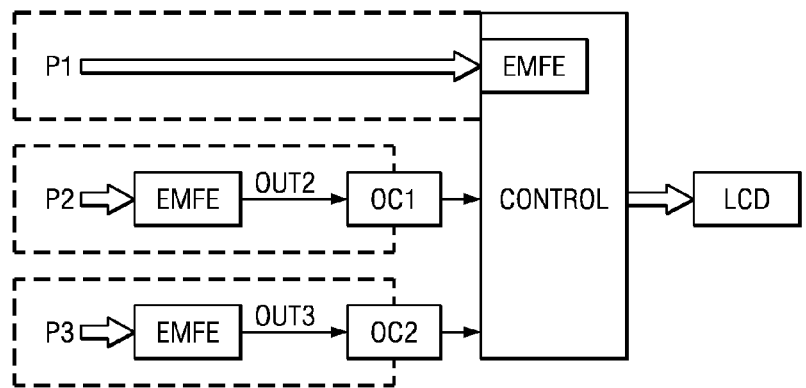
FIG. 2 is an alternative implementation of a conventional electronic energy meter (prior art)
Figure 3:
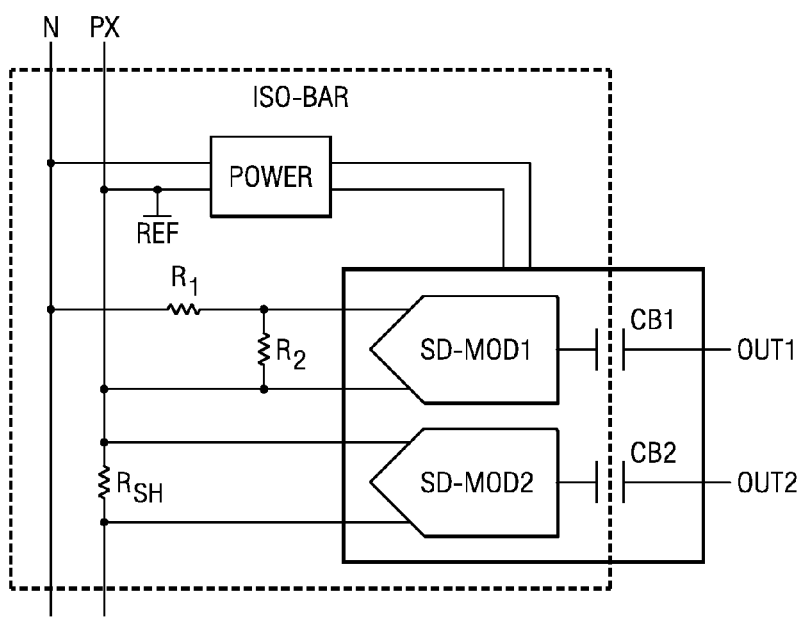
FIG. 3 is a simplified schematic of an electronic energy meter according to a first embodiment of the invention.

FIG. 3 shows an electronic energy meter front-end, which be used in a watt-hour meter to measure consumption of electric power in a domestic or industrial environment. In FIG. 3, the energy meter measures the current through a phase or live line Px and also measures the voltage between live line Px and neutral line N. Power supply stage POWER has one input connected to live line Px and one input connected to neutral wire N. The input connected to live line Px is also the reference ground REF of the front-end. Power supply stage POWER has two outputs, each connected to a sigma delta modulator SD-MOD1 and SD-MOD2. Power supply stage POWER supplies power to two sigma delta modulators SD-MOD1 and SD-MOD2. Each sigma delta modulator has two inputs. Sigma delta modulator SD-MOD1 has a first input connected to phase line Px and a second input connected to neutral line N via a resistor R1. Second resistor R2 is connected between the two inputs of the sigma delta modulator SD-MOD1. Resistors R1 and R2 form a voltage divider. Sigma delta modulator SD-MOD2 has two inputs connected to live line Px across shunt resistor $R_{SH}$. Shunt resistor $R_{SH}$ is connected in live line Px between an interconnection of live line Px and the two inputs of sigma delta modulator SD-MOD2. The digital outputs of both sigma delta modulators SD-MOD1 and SD-MOD2 are electrically isolated by respective isolation barriers. Capacitive isolation elements CB1 and CB2 provide capacitive coupling through a capacitive isolation barrier. Capacitive elements CB1 and CB2 at the outputs of the sigma delta modulators SD-MOD1 and SD-MOD2 form part of the general isolation barrier ISO-BAR, which electrically isolates the whole metering front-end. The capacitive coupling of capacitive isolation barrier ISO-BAR transmits the output signals of sigma delta modulators SD-MOD1 and SD-MOD2 through the barrier. Capacitive coupling is highly advantageous compared to an optocoupler because it is cheaper to manufacture and consumes no current itself. Each sigma delta modulator has an order of two with a single bit output stream. A single capacitive coupling element (i.e. a single portion of a capacitive isolation barrier) is used for each single bit output sigma-delta modulator. These features allow the energy meter to be small in size and only little complex.

The power supply stage POWER supplies power to both of sigma delta modulators SD-MOD1 and SD-MOD2. A shunt device, implemented as shunt resistor $R_{SH}$, measures the current flowing through live line Px. The voltage divider including resistors R1 and R2 measure the voltage between live line Px and neutral line N. Sigma-delta modulators SD-MOD1 and SD-MOD2 convert the analog measurement data from voltage divider R1 and R2 and the shunt resistor $R_{SH}$ into respective digital data. Sigma-delta modulators SD-MOD1 and SD-MOD2 provide digital data output at and through electrical isolation barrier ISO-BAR using respective capacitive isolation elements CB1 and CB2. Digital output OUT1 of sigma delta modulator SD-MOD1 indicates the voltage drop between live Px and neutral N lines. Digital output OUT2 of sigma delta modulator SD-MOD2 indicates the current flowing through live line Px. The data outputs can then be fed to a decimator (not shown in FIG. 3) for conversion into a suitable format for a digital read out device, such as LCD display.

Figure 4:
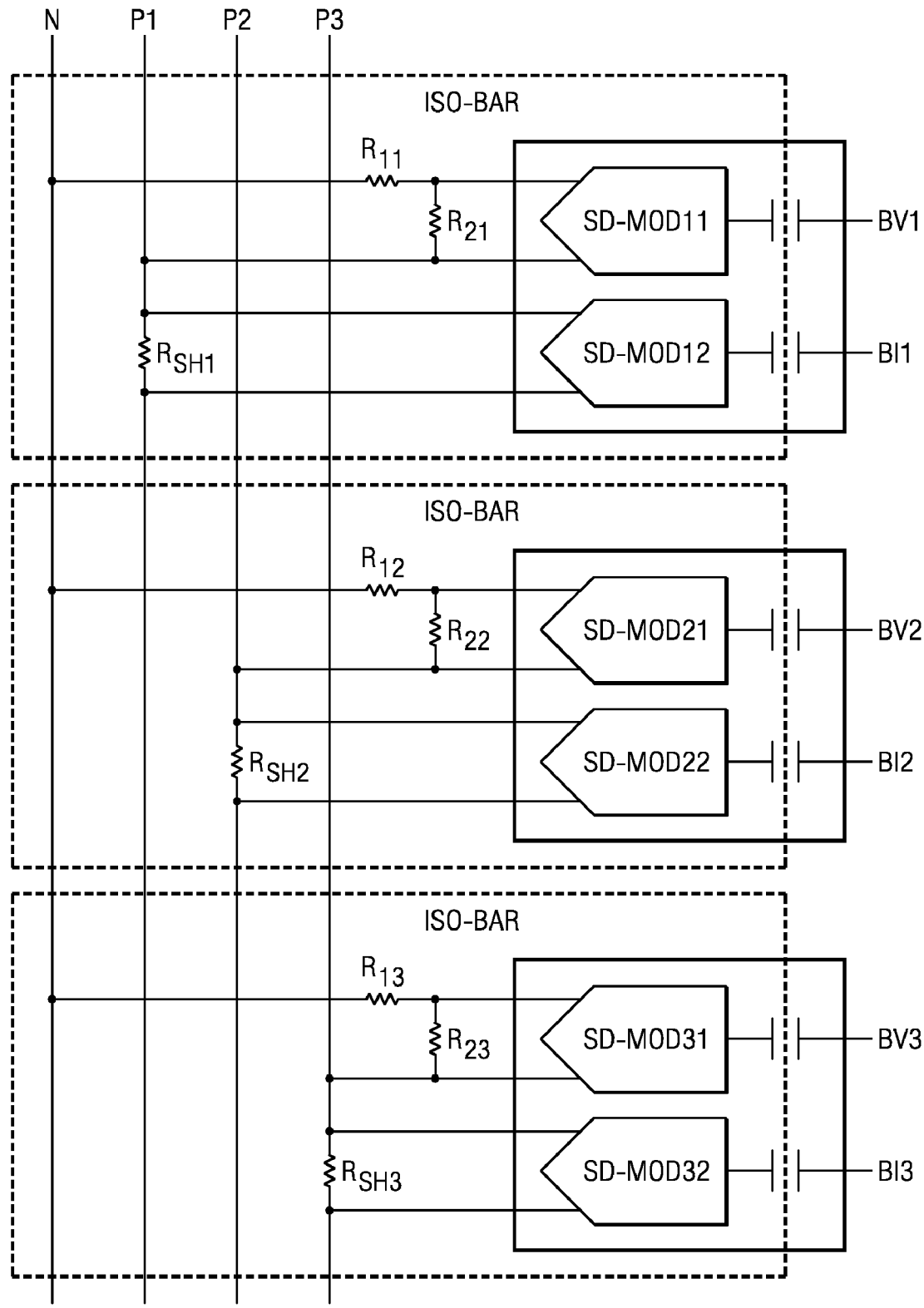
FIG. 4 is a simplified schematic of an electronic energy meter according to a second embodiment of the invention.

Most domestic and industrial electrical systems (for example the ring main wiring in a house) have three live lines and one neutral line. These three live lines have three different phases. FIG. 4 shows an electronic energy meter according to a second embodiment of the invention that is suitable for measuring current through each of three live lines P1, P2 and P3 and voltage between each of live lines P1, P2 and P3 and neutral line N. The second embodiment is almost the same as that of the first embodiment shown in FIG. 3, except that there are three pairs of sigma delta modulators SD-MOD11/SD-MOD12, SD-MOD21/SD-MOD22 and SD-MOD31/SD-MOD32. Each pair of sigma delta modulators and their associated front end are individually electrically isolated by respective isolation barriers ISO-BAR. Individually isolating each pair SD-MOD11/SDMOD12, SD-MOD21/SD-MOD22 and SD-MOD31/SD-MOD32 of sigma delta modulators from each other isolates the different phases or live lines from each other. One sigma delta modulator in each pair has one input connected the neutral line N and one input connected to live line P1, P2 or P3 via a voltage divider formed of an arrangement of a respective pair of resistors R11 and R21; R12 and R22; or R13 and R23. The resistor pairs enable measuring the voltage between each of live lines P1, P2 and P3 and neutral line. The other sigma delta modulator in each pair has two inputs both connected to a respective one of live lines P1, P2 or P3 for measuring the current through the corresponding live line P1, P2 or P3 from shunt resistors $R_{SH1}$, $R_{SH2}$ and $R_{SH3}$ arranged in the respective live lines P1, P2 and P3. These other sigma delta modulator have inputs connected across the corresponding shunt resistor $R_{SH1}$, $R_{SH2}$ and $R_{SH3}$ in the corresponding live line P1, P2 or P3. Each sigma delta modulator has a digital output electrically isolated which is transmitted through an isolation barrier by a corresponding capacitive coupling.

The operation of the energy meter of FIG. 4 is the same as that of the first embodiment illustrated in FIG. 3. A power supply stage (not shown in FIG. 4) supplies power to each of the sigma-delta modulators. Analog measurements of the voltage between each of the live lines P1, P2 and P3 and the neutral line N from the voltage dividers R11, R21; R12, R22; and R13, R23 are converted by one sigma delta modulator in each pair to respective digital output signals BV1, BV2 and BV3 to give a digital representation of the voltage at the digital output. In addition, analog measurements of the current through each of the live lines P1, P2, and P3 from the shunt resistors $R_{SH1}$, $R_{SH2}$ and $R_{SH3}$ are converted by the other sigma delta modulator in each pair to respective digital output signals BI1, BI2 and BI3 to give a digital representation of the current at the digital output. Digital output signals BI1, BI2 and BI3 can then be converted by suitable means such as a decimator, so that the current and voltage levels can be read out by a device such as an LCD display. This arrangement allows currents and voltages from several different live lines to be measured at once without modification the front end of the energy meter.

FIG. 5 shows an electronic energy meter according to a third embodiment of the invention. This third embodiment is an example of how the digital signals output from the sigma delta modulators can be read out as information about the power consumed in an electrical system. Three isolated sigma delta modulators are provided with a corresponding individual electrical isolation barrier ISO-BAR so that they are electrically isolated from each other and each has an electrically isolated digital output. Analog input signals P1, P2 and P3 representing the current measured through three different live lines are input to the three sigma delta modulators. Each sigma delta modulator provides a digital output signal representative of the current through the three respective live lines. The three digital output signals are fed to a corresponding decimator DEC provided within a control stage CONTROL, which may be a microcontroller. The three decimators DEC are digital decimation filters that convert the three digital outputs from the isolated sigma delta modulators into a value of the integral of the total power consumed with respect to time in Watt-hours. This is output from the control stage CONTROL and displayed (usually in kilowatt hours (kWh)) on a liquid crystal display LCD.

FIGS. 6A and 6B show a fourth embodiment of an electronic energy meter according to the invention. FIG. 6A gives a general overview of the embodiment, in which an isolated sigma delta modulator ISO-SD-MOD receives a clock input CLK, as well as an analog measurement input Px from an electrical line and provides a digital data output DATA. FIG. 6B shows the electronic energy meter in more detail. The isolated sigma delta modulator ISO-SD-MOD is electrically isolated completely by an isolation barrier and contains two separate sigma delta modulators. A first sigma delta modulator has a first input receiving an analog current measurement signal I from a live line and a second input receiving an analog voltage measurement signal V indicating the voltage drop between the live line and a neutral line. Both sigma delta modulators have a clock input receiving a clock signal CLK. The isolated sigma delta modulator ISO-SD-MOD has an electrically isolated input with an isolation barrier and an isolating and capacitive coupling element C1 for inputting the clock signal CLK. The sigma delta modulator that receives the current measurement signal I has an electrically isolated digital data output with a capacitive isolation barrier and a capacitive coupling element C2 outputting current bit stream BI representing the current through the live line. The sigma delta modulator that receives the voltage measurement signal V has an electrically isolated digital data output with a capacitive element C3 outputting voltage bit stream Bv representing the voltage level of the live line. Applying the clock signal CLK to the two sigma delta modulators allows real synchronous operation of all front-ends. Thus the current and voltage can be measured synchronously so that very precise measurements of the phase relation are possible. This removes the need for extensive phase correction algorithms to achieve very accurate energy measurement results. Currents and voltages from all phases (live lines) can be measured at the same time using a single control stage.

FIG. 7 shows an alternative implementation of the embodiment shown in FIG. 5. Instead of providing three isolated sigma delta modulators with digital outputs connected to a control stage as shown in FIG. 5, FIG. 7 shows only two isolated sigma delta modulators ISO-SD-MOD provided outside the control stage CONTROL. Two further sigma delta ADCs SD-ADC are provided inside control stage CONTROL. The isolated sigma delta modulators ISO-SD-MOD are individually electrically isolated with isolation barriers. They have electrically isolated digital outputs connected to decimators DEC inside the control stage CONTROL. One of the isolated sigma delta modulators ISO-SD-MOD has an input for receiving a signal P2 and the other isolated sigma delta modulator ISO-SD-MOD has an input for receiving a signal P3. P2 and P3 contain current and voltage measurement information from two different live lines. Current and voltage measurement information from a third live line is contained in a signal P1. Signal P1 is input to both of the sigma delta ADCs SD-ADC in the control stage CONTROL. Isolated sigma delta modulators ISO-SD-MOD output bit streams of data representing the current through and voltage levels of the electrical lines. The difference in this embodiment is that analog current and voltage measurement information from the third live line is converted into digital data by the sigma delta ADCs SD-ADC within the control stage CONTROL. Control stage CONTROL can be a standard microcontroller, which outputs current and voltage information from all three of the live lines to an LCD to be read out as digital data. Providing the decimator stages necessary for post-processing of the sigma delta modulator only in the control stage reduces costs and power consumption of the front stage. Using this architecture, the whole energy meter of the present invention profits from reduced bit size of the sigma delta modulators.

Although the present invention has been described herein with reference to specific embodiments, it is not limited to these embodiments and no doubt further alternatives will occur to the skilled person that lie within the scope of the invention as claimed. For example, the electronic energy meter according to the invention is not limited to obtaining current and voltage information from just three live lines. As many pairs of sigma delta modulators or individual isolated sigma delta modulators as are needed can be provided in the meter, corresponding to the number of live lines required to be measured.

This invention can also be used to measure the current through the neutral line as well as through the live line with shunts as it is required in some countries to detect tampering and still be able to bill the consumed energy correctly.

What is claimed is:

1. An electronic energy meter comprising:
a shunt device coupled to a first electrical line;
a first sigma delta modulator having an input coupled the shunt device for measuring a current through the first electrical line and generating a first digital data output;
a voltage divider coupled to the first electrical line;
a second sigma delta modulator having an input coupled to the voltage divider for measuring a voltage level of the first electrical line and generating a second digital data output;
a capacitive isolation barrier coupled to the first sigma delta modulator for electrically isolating said first digital output and to the second sigma delta modulator for electrically isolating said second digital output; and
a power supply stage coupled to the first electrical line and providing a supply voltage to the first sigma delta modulator and the second sigma delta modulator.

2. The electronic energy meter according to claim 1, wherein:
the first sigma delta modulator is configured to output a bit stream at the isolated digital data output representing the current through the first electrical line; and
the second sigma delta modulator is configured to output a bit stream at the isolated digital output representing a voltage level of the first electrical line.

3. The electronic energy meter according to claim 1, further comprising:
the first sigma delta modulator includes a clock signal input; and
the capacitive isolation barrier further electrically isolated the clock signal input for inputting a clock signal.

4. The electronic energy meter according claim 1, wherein:
the first sigma delta modulator is a second order sigma delta modulator.

5. The electronic energy meter according to claim 1, wherein:
the digital data output of the sigma delta modulator has a single bit output data stream.

6. An electronic energy meter for measuring energy delivered on three-phase power supply having first, second and third live lines and one neutral line comprising:
a first shunt device coupled to the first live line;
a first sigma delta modulator having an input coupled the first shunt device for measuring a current through the first electrical line and generating a first digital data output;
a first voltage divider coupled between the first live line and the neutral line;
a second sigma delta modulator having an input coupled to the first voltage divider for measuring a voltage level of the first live line and generating a second digital data output;
a first capacitive isolation barrier coupled to the first sigma delta modulator for electrically isolating said first digital output and to the second sigma delta modulator for electrically isolating said second digital output;
a second shunt device coupled to the second live line;
a third sigma delta modulator having an input coupled the second shunt device for measuring a current through the second electrical line and generating a third digital data output;
a second voltage divider coupled between the second live line and the neutral line;
a fourth sigma delta modulator having an input coupled to the second voltage divider for measuring a voltage level of the second live line and generating a fourth digital data output;
a second capacitive isolation barrier coupled to the third sigma delta modulator for electrically isolating said third digital output and to the fourth sigma delta modulator for electrically isolating said fourth digital output;
a third shunt device coupled to the third live line;
a fifth sigma delta modulator having an input coupled the third shunt device for measuring a current through the third electrical line and generating a firth digital data output;
a third voltage divider coupled between the third live line and the neutral line;
a sixth sigma delta modulator having an input coupled to the voltage divider for measuring a voltage level of the third live line and generating a sixth digital data output;
a third capacitive isolation barrier coupled to the fifth sigma delta modulator for electrically isolating said fifth digital output and to the sixth sigma delta modulator for electrically isolating said sixth digital output; and
a power supply stage coupled to the first live line the neutral line providing a supply voltage to the first sigma delta modulator, the second sigma delta modulator, the third sigma delta modulator, the fourth sigma delta modulator, the fifth sigma delta modulator and the sixth sigma delta modulator.

7. The electronic energy meter of claim 6, wherein:
the first sigma delta modulator includes a clock signal input;
the second sigma delta modulator includes a clock signal input;
the first capacitive isolation barrier further electrically isolates the clock signal inputs of the first sigma delta modulator and of the second sigma delta modulator for inputting a clock signal;
the third sigma delta modulator includes a clock signal input;
the third sigma delta modulator includes a clock signal input;
the second capacitive isolation barrier further electrically isolates the clock signal inputs of the third sigma delta modulator and of the fourth sigma delta modulator for inputting the clock signal;
the fifth sigma delta modulator includes a clock signal input;
the sixth sigma delta modulator includes a clock signal input;
the third capacitive isolation barrier further electrically isolates the clock signal inputs of the fifth sigma delta modulator and of the sixth sigma delta modulator for inputting the clock signal; and wherein the first sigma delta modulator, the second sigma delta modulator, the third sigma delta modulator, the fourth sigma delta modulator, the fifth sigma delta modulator and the sixth sigma delta modulator are responsive to the clock signal for synchronous measurement.

* * * * *